United States Patent
Varonen et al.

(10) Patent No.: US 12,142,808 B2
(45) Date of Patent: Nov. 12, 2024

(54) WILKINSON DIVIDER

(71) Applicant: TEKNOLOGIAN TUTKIMUSKESKUS VTT OY, Espoo (FI)

(72) Inventors: Mikko Varonen, Espoo (FI); Antti Lamminen, Espoo (FI)

(73) Assignee: TEKNOLOGIAN TUTKIMUSKESKUS VTT OY, Espoo (FI)

( * ) Notice: Subject to any disclaimer, the term of this patent is extended or adjusted under 35 U.S.C. 154(b) by 557 days.

(21) Appl. No.: 17/440,523

(22) PCT Filed: Mar. 17, 2020

(86) PCT No.: PCT/FI2020/050165
§ 371 (c)(1),
(2) Date: Sep. 17, 2021

(87) PCT Pub. No.: WO2020/188146
PCT Pub. Date: Sep. 24, 2020

(65) Prior Publication Data
US 2022/0166122 A1    May 26, 2022

(30) Foreign Application Priority Data
Mar. 18, 2019   (FI) .................................... 20195200

(51) Int. Cl.
*H01P 5/16*       (2006.01)
*H01L 23/66*      (2006.01)
*H01Q 21/00*      (2006.01)

(52) U.S. Cl.
CPC ............ *H01P 5/16* (2013.01); *H01L 23/66* (2013.01); *H01Q 21/0075* (2013.01); *H01L 2223/6627* (2013.01); *H01L 2223/6683* (2013.01)

(58) Field of Classification Search
CPC ............ H01Q 21/0075; H01L 23/66; H01L 2223/6683; H01L 2223/6627; H01P 5/16
See application file for complete search history.

(56) References Cited

U.S. PATENT DOCUMENTS 4,901,042 A * 2/1990 Terakawa ............... H03H 7/48
                                          333/127
5,528,209 A    6/1996 MacDonald et al.
(Continued)

FOREIGN PATENT DOCUMENTS

| CN | 102237165  | 11/2011 |
| JP | S5349930   | 5/1978  |
| JP | 2015-69999 | 4/2015  |

OTHER PUBLICATIONS

International Search Report and Written Opinion of the ISA for PCT/FI2020/050165, mailed Jun. 25, 2020, 12 pages.
(Continued)

*Primary Examiner* — Quan Tra
(74) *Attorney, Agent, or Firm* — Nixon & Vanderhye PC

(57) ABSTRACT

A hybrid millimeter-wave Wilkinson divider comprises an input port (1), a first output port (2), a second output port (3), and transmission lines connecting the input port (1) to the first and second output ports (2, 3) implemented by transmission lines in a carrier substrate (PCB, 31). An isolation resistor of the Wilkinson divider connected between the first and second output ports (2, 3) is integrated in a monolithic micro-wave integrated circuit (MMIC) chip (40) installed on the carrier substrate. On the MMIC chip the isolation resistor is connected between RF input metal pads. A compensation circuit for parasitic capacitances caused by the RF input metal pads is provided on the MMIC chip (40) so that the on-chip resistor appears as a pure resistance to the output ports (2, 3) of the Wilkinson divider on the carrier substrate (PCB, 31).

13 Claims, 5 Drawing Sheets

(56) References Cited

U.S. PATENT DOCUMENTS

| | | |
|---|---|---|
| 6,570,466 B1 | 5/2003 | Bahl |
| 10,886,591 B1 * | 1/2021 | Lin .......................... H01P 5/16 |
| 2008/0136566 A1 | 6/2008 | Kim et al. |
| 2011/0204976 A1 | 8/2011 | Masuda |
| 2014/0132364 A1 | 5/2014 | Ehyaie |
| 2016/0191004 A1 * | 6/2016 | Chueh ...................... H01P 5/12 |
| | | 333/128 |
| 2018/0145054 A1 | 5/2018 | Kim et al. |
| 2019/0103648 A1 * | 4/2019 | Chueh ...................... H01P 5/16 |
| 2020/0395660 A1 * | 12/2020 | Kuroda .................... H01Q 1/22 |
| 2021/0151850 A1 * | 5/2021 | Yoshioka ................. H01P 3/08 |

OTHER PUBLICATIONS

Search Report for FI20195200, Oct. 8, 2019, 2 pages.

Zihir et al., "60-GHz 64- and 256-Elements Wafer-Scale Phased-Array Transmitters Using Full-Reticle and Subreticle Stitching Techniques", IEEE Transaction on Microwave Theory and Techniques, vol. 64, No. 12, Dec. 1, 2016, pp. 4701-4719.

Nishikawa et al., "Miniaturized Wilkinson Power Divider Using Three-Dimensional Mmic Technology", IEEE Microwave and Guided Wave Letters, vol. 6, No. 10, pp. 372-374.

Kibaroglu et al., "A 64-Element 28-GHz Phased Array Transceiver with 52-dBm EIRP and 8-12-Gb/s 5G Link at 300 Meters Without Any Calibration", IEEE Transactions nn Microwave Theory and Techniques, vol. 66, No. 12, Dec. 2018.

* cited by examiner

WILKINSON DIVIDER

This application is the U.S. national phase of International Application No. PCT/FI2020/050165 filed 17 Mar. 2020, which designated the U.S. and claims priority to FI patent application Ser. No. 20/195,200 filed 18 Mar. 2019, the entire contents of each of which are hereby incorporated by reference.

FIELD OF THE INVENTION

The invention relates to millimeter wave devices, and particularly to millimeter wave Wilkinson dividers and millimeter wave phased arrays.

BACKGROUND OF THE INVENTION

The use of three-port power dividers is especially important for antenna array systems that utilize a power-splitting network, such a corporate or parallel feed system. The corporate is simply a device that splits power between n output ports with a certain distribution while maintaining equal path lengths from input to output ports. It can be implemented with n-way power splitters where three-port power dividers are commonly used.

The Wilkinson power divider is a three-port network that is lossless when the output ports are matched; where only reflected power is dissipated. Input power can be split into two or more in-phase signals with the same amplitude. As illustrated in FIG. 1, the Wilkinson divider circuit may comprise two quarter wavelength ($\lambda/4$) transmission lines TL1 and TL2 connected together directly at one end (port 1), and a resistor $R_s$ connected between the other ends (ports 1 and 3) of the transmission lines. The resistor $R_s$ isolates port 2 and port 3 and allows all three ports to be matched. Generally, for an equal amplitude combiner/divider in a $Z_0$ impedance system, the transmission lines TL1 and TL2 having a characteristic impedance of $Z_0\sqrt{2}$ and a lumped isolation resistor of $2Z_0$ with all three ports matched, high isolation between the output ports is obtained. Due to the symmetry, equal amplitude, in-phase combining/dividing is automatically ensured. A section of transmission line having an impedance of $Z_0$ may further be connected at each of the three ports. For the case of equal amplitude combiner/divider in a 50Ω system, a resistance of the resistor is 100Ω, an the characteristic impedance of both transmission lines TL1 and TL2 is $50\sqrt{2}Ω$ (~70.7Ω). The design of an equal-split (3 dB) Wilkinson is often made in stripline or microstrip form. The isolation resistor $R_s$ is generally implemented by means of a discrete resistor, e.g a surface mounted device (SMD) resistor which is a preferred technology for the resistors in modern printed circuits. SMD resistors are available in different sizes which implies different dimensions of the pads required to attach (solder) the isolation resistor.

Antenna arrays, or phased array antennas, are often used in modern telecommunication and radar systems. As well known in the art, a phased array includes multiple radiating elements, such as 16, 64 or 256 elements. A power distribution network or a feeding network is provided that splits a signal power from a single input (one transmitter) between multiple output ports (the multiple radiating elements). In principle, each power division by two can be done passively, as with a Wilkinson power divider. FIG. 2 illustrates a 1-to-8 feeding network 2 in which the Tx signal is splitted by a first Wilkinson divider W1 to two parallel 1-to-4 feeding networks W2, W3, W4 and W2', W3', W4', respectively which feed eight outputs or radiating elements AF1-AF8n total. A Wilkinson divider feeding network requires a lot of routing but, on the other hand, ensures signal amplitude and phase uniformity among all front-ends. Nevertheless, as the size of the array grows, the amount of routing and the size of the feeding network increases rapidly.

Millimeter wave bands have conventionally been employed in radar systems. Recently, since the microwave bands applied in mobile cellular systems such as Global System for Mobile Communications (GSM) and Universal Mobile Telecommunications System (UMTS) cannot support high-data-rate traffic, millimeter wave bands have received more attention, for example, 60 GHz bands, which can provide a bandwidth of several GHz for these short-range communications. In addition, the communications in the 60 GHz band have some advantanges such as the possible miniaturization of the analog components and antennas.

Wilkinson divider configuration can be employed also for millimeter-wave antenna array feeding networks. In one approach, the feeding network for the antenna arrays comprises stripline Wilkinson dividers on a. However, the challenge in the PCB environment is the implementation of the isolation resistor of the Wilkinson divider. Discrete resistors, such SMD resistors at frequencies of 60 GHz and higher are expensive and for large arrays they might not be easily assembled. An alternative approach might be LTCC (low temperature co-fired ceramics) technology which has "built-in" resistors but the price of LTCC technology is higher than that of the basic PCB technology.

Wilkinson power splitters can also be implemented with a Monolithic Millimeter-wave Integrated Circuit (MMIC) technology, in which passive elements and interconnections are fabricated on the same semiconductor substrate as active devices. Example of this approach is disclosed in "60-GHz 64- and 256-Elements Wafer-Scale Phased-Array Transmitters Using Full-Reticle and Subreticle Stitching Techniques", Samet Zihir et al, IEEE Transactions On Microwave Theory And Techniques, Vol. 64, No. 12, p. 4701-4719, December 2016. The same silicon wafer was used for the RF distribution network, power and SPI distribution, and phased-array channel Antennas were on a separate quartz wafer mounted on top of the silicon wafer The 1-64 distribution network divides the power equally to all phased-array channels, which being on the same wafer are very similar to each other.

However, a problem with of such on-chip power splitters is that they consume expensive MMIC area and additionally may lead to an extra power loss because of an additional wiring needed between the phased array cells.

BRIEF DESCRIPTION OF THE INVENTION

An aspect of the invention to provide a new Wilkinson divider design for millimeter wave frequencies which provides a cost effective and feasible implementation especially in large array feeding networks. The aspect of invention is characterized by what is stated in the independent claims. The preferred embodiments of the invention are disclosed in the dependent claims.

An aspect of the invention is a hybrid millimeter-wave Wilkinson divider device, comprising
a carrier substrate,
an input port, a first output port, a second output port, and transmission lines connecting the input port to the first and second output ports implemented by transmission lines in the carrier substrate, an isolation resistor connected between the first and second output ports, and the isolation resistor of the Wilkinson divider is integrated in a monolithic microwave integrated circuit (MMIC) chip installed on the carrier substrate, wherein the MMIC chip comprises a first input metal pad and a second input metal pad connected to first and second output ports, respectively, on the carrier substrate, and wherein the isolation resistors connected between the first input metal pad and the second input metal pad in the MMIC chip, and the MMIC chip further comprises a first parallel resonant circuit for compensating a parasitic capacitance of the first input metal pad and a second parallel resonant circuit for compensating a parasitic capacitance of the second input metal pad.

A further aspect of the invention is a hybrid millimeter-wave device, comprising
a carrier substrate,
at least one monolithic microwave integrated circuit (MMIC) chip installed on the carrier substrate,
a signal distribution network configured to feed one input signal to a plurality outputs, the signal distribution network including a plurality of Wilkinson dividers, each of the plurality of Wilkinson dividers further comprising an input port, a first output port, a second output port, transmission lines connecting the input port to the first and second output ports, and an isolation resistor connected between the first and second output ports, and
wherein the transmission lines of each Wilkinson divider is implemented in the carrier substrate, and the isolation resistor of each Wilkinson divider integrated in the at least one MMIC chip, and
wherein the MMIC chip comprises a first input metal pad and a second input metal pad connected to first and second output ports, respectively, on the carrier substrate, and wherein the isolation resistors connected between the first input metal pad and the second input metal pad in the MMIC chip, and the MMIC chip further comprises a first parallel resonant circuit for compensating a parasitic capacitance of the first input metal pad and a second parallel resonant circuit for compensating a parasitic capacitance of the second input metal pad.

In an embodiment, the signal distribution network is a 1-to-4, 1-to-8, 1-to-16, 1-to-64, 1-to-256, or 1-to-512 network, or any combination thereof.

In an embodiment, the first parallel resonant circuit comprises a first inductance connected from the first input metal pad to ground in the MMIC chip and thereby in parallel with the parasitic capacitance of the first input metal pad, and whereby the second parallel resonant circuit comprises a second inductance connected from the second input metal pad to ground in the MMIC chip and thereby in parallel with the parasitic capacitance of the second input metal pad.

In an embodiment, the MMIC chip comprises a third metal pad and a fourth connected to the ground, and wherein the first inductance is connected between the first input metal pad and the third metal pad, and wherein the second inductance is connected between the second input metal pad and the fourth metal pad.

In an embodiment, the third and fourth metal pads are configured to be ground contacts between the MMIC chip and the carrier substrate.

In an embodiment, the MMIC chip further comprises at least one further integrated component and/or electronic circuit. In an embodiment, the carrier substrate is based on a printed circuit board (PCB) technology, Low-temperature co-fired ceramic (LTCC) technology, integrated passive device (IPD) technology, or quartz substrate. A still further aspect of the invention is a millimeter wave phased array comprising at least one or a plurality of millimeter wave Wilkinson divider devices according embodiments of the invention.

A still further aspect of the invention is a monolithic microwave integrated circuit (MMIC) chip, comprising
at least a first input metal pad and a second input metal pad for mounting the MMIC chip on a carrier substrate,
at least one integrated isolation resistor configured, when the MMIC chip is mounted on the carrier substrate, to be connected via the first and second input metal pads to transmission lines in the carrier substrate to form a hybrid millimeter-wave Wilkinson divider with said carrier substrate transmission lines, and
wherein the MMIC chip comprises a first parallel resonant circuit and a second parallel resonant circuit on the MMIC chip configured to compensate a parasitic capacitances of the first input metal pad and the second input metal pad, respectively, and wherein the first parallel resonant circuit preferably comprises a first inductance connected from the first input metal pad to ground and thereby in parallel with the parasitic capacitance of the first input metal pad, and whereby the second parallel resonant circuit preferably comprises a second inductance connected from the second input metal pad to ground and thereby in parallel with the parasitic capacitance of the second input metal pad.

In an embodiment, the MMIC chip comprises a third metal pad and a fourth connected to the ground, and wherein the first inductance is connected between the first input metal pad and the third metal pad, and wherein the second inductance is connected between the second input metal pad and the fourth metal pad, and wherein the third and fourth metal pads are preferably configured to be ground contacts between the MMIC chip and the carrier substrate.

In an embodiment, the MMIC chip comprises a plurality of integrated isolation resistors with respective pairs of first and second input metal pads to be connected to a plurality of transmission lines in the carrier substrate to form a plurality of hybrid millimeter-wave Wilkinson dividers, and wherein the MMIC chip optionally comprises at least one further integrated component and/or electronic circuit.

BRIEF DESCRIPTION OF THE DRAWINGS

In the following the invention will be described in greater detail by means of exemplary embodiments with reference to the attached drawings, in which.

DESCRIPTION OF EXEMPLARY EMBODIMENTS

An aspect of the invention is a hybrid Wilkinson power divider or splitter which uses a carrier substrate or board for transmission line routing and a Monolithic Millimeter-wave Integrated Circuit (MMIC) technology for a resistor implementation. Transmission lines may be implemented in various alternative structures, such as microstrip line, stripline, coplanar waveguide (CPW). In the example embodiments, transmission lines are mostly implemented with microstrip lines, but embodiments of the invention are not restricted to the use of microstrip lines. The carrier substrate or board (which can also be referred to as an RF platform) suitable for embodiments of the invention can be manufactured using various different types of technologies, such as printed circuit board (PCB), Low-temperature cofired ceramic (LTCC), integrated possessive device (IPD), quartz wafer, etc. The exemplary embodiments herein will be described and illustrated using the PCB technology as an example without intention to restrict embodiments of the invention to this technology. The novel hybrid, e.g. PCB/MMIC or LTCC/MMIC, Wilkinson power divider design may lead to minimal signal loss due to the routing and to minimal MMIC area consumption. The use of PCB technology for the transmission line routing, and implementation of the isolation resistor with a very small MMIC area, result in very cost-efficient Wilkinson design in comparison with conventional designs. The low manufacturing cost of the Wilkinson divider is especially advantageous in applications having large arrays, such as in 5G telecommunication applications where every lamp post may have phased array radio-frontend(s) with several hundred radiating elements.

Figure 3:
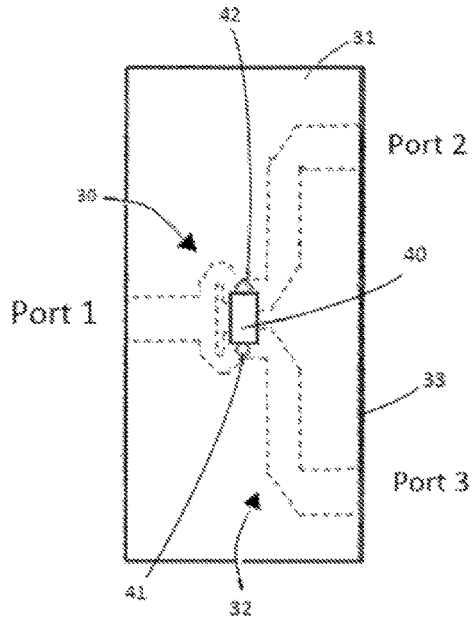
FIG. 3 shows a top view of a hybrid Wilkinson power divider according to an embodiment of the invention.
Figure 4:
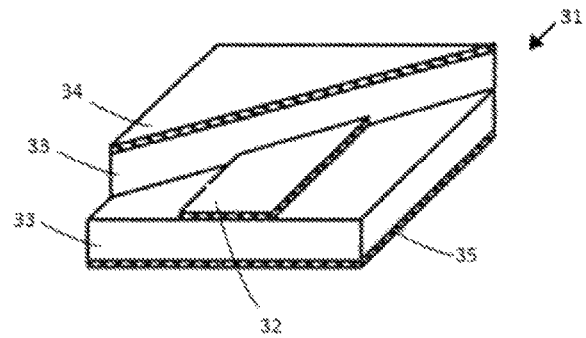
FIG. 4 shows a partially cross-sectional perspective view of a multilayer PCB.

An example of a hybrid Wilkinson power divider according to an embodiment of the invention is illustrated in FIG. 3. The exemplary Wilkinson divider 30 has a transmission lines and routing in form of microstrip lines 32 in one or more electrically conductive layers of a carrier substrate (e.g. a printed circuit board PCB) 31, eg. metal layers. In an embodiment the carrier substrate 31 may be a multilayer carrier substrate (e.g. PCB or LTCC), and at least part of the microstrip lines 32 implementing transmission line routing may be provided in an intermediate electrically conductive layer between dielectric layers 33, for example as illustrated in FIG. 4. However, any one or ones of the conductive layers, such as conductive top and bottom layers 34 and 35, and possible other layers, may be utilized transmission line routing. The dielectric layers 33 of the carrier substrate 31 may be made of any suitable dielectric material. In FIG. 3, a MMIC chip resistor 40 installed on the carrier substrate 31 and connected between output ports 2 and 3. Contact bumps or pads 41 and 42 may be provided for making the connection.

Figure 1:
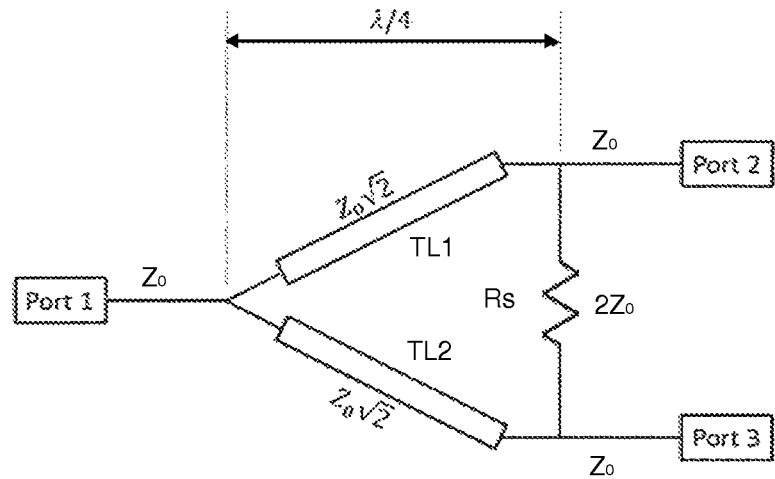
FIG. 1 illustrates a basic configuration of a Wilkinson power divider.
Figure 5:
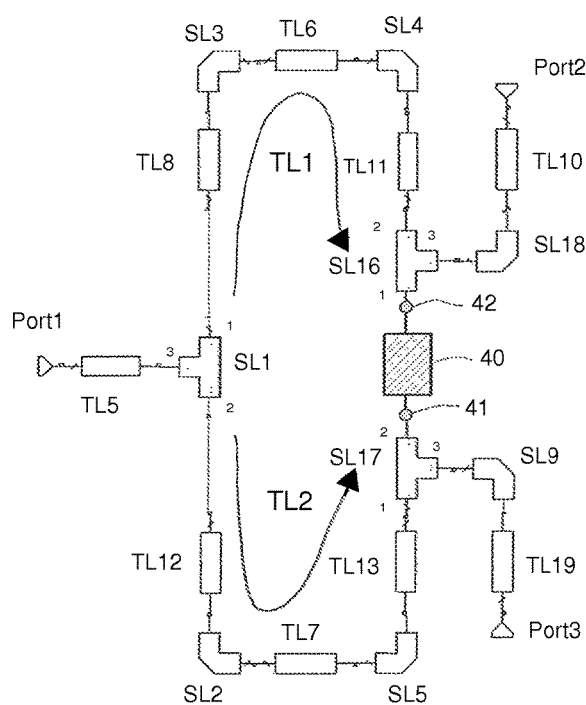
FIG. 5 illustrates an exemplary design of a hybrid Wilkinson power divider according to an embodiment of the invention.

An exemplary model of a hybrid Wilkinson power divider according to an embodiment of the invention is illustrated in FIG. 5. Port 1 is connected by a transmission line TL5 (eg. a straight microstrip line with length 4 mm and width 1 mm) to a branching T microstrip line SL1 (eg. having width 1 mm at the input branch 3 and width 2 mm at the output branches 1 and 2). Series connection of a straight transmission line TL8 (e.g. a straight microstrip line with length ½ mm and width 2 mm), a corner microstrip line SL3 (eg. having width 2 mm), a straight transmission line TL6 (eg. a straight microstrip line with length 1 mm and width 2 mm), a corner microstrip line SL4 (eg. having width 2 mm), and a straight transmission line TL8 (e.g. a straight microstrip line with length ½ mm and width 2 mm) is connected to one input branch (e.g. branch 2) of a branching T microstrip line SL61 (eg. having width 2 mm at the input branches 1 and 2 and 3 mm at the output branch 3). The output of the branching T microstrip line SL16 is connected via a series connection of a corner microstrip line SL18 (eg. having width 3 mm) and a straight transmission line TL10 (eg. a straight microstrip line with length 3 mm and width 3 mm) to a port 2 of the Wilkinson divider. Thus the upper portion of the Wilkinson divider shown in FIG. 5 may represents the transmission line between the ports 1 and 2 in the Wilkinson divider shown in FIG. 3, or generally in FIG. 1. Similarly, a series connection of a straight transmission line TL12 (e.g. a straight microstrip line with length ½ mm and width 2 mm), a corner microstrip line SL2 (eg. having width 2 mm), a straight transmission line TL7 (eg. a straight microstrip line with length 1 mm and width 2 mm), a corner microstrip line SL5 (eg. having width 2 mm), and a straight transmission line TL13 (e.g. a straight microstrip line with length ½ mm and width 2 mm) is connected to one input branch (e.g. branch 1) of a branching T microstrip line SL17 (eg. having width 2 mm at the input branches 1 and 2 and 3 mm at the output branch 3). The output of the branching T microstrip line SL17 is connected via a series connection of a corner microstrip line SL19 (eg. having width 3 mm) and a straight transmission line TL10 (eg. a straight microstrip line with length 3 mm and width 3 mm) to a port 3 of the Wilkinson divider. Thus the lower portion of the Wilkinson divider shown in FIG. 5 may represents the transmission line between the ports 1 and 3 in the Wilkinson divider shown in FIG. 3, or generally in FIG. 1. Further, the branch 1 of the branching T microstrip line SL16 is connected to an RF pad 42 on the carrier substrate 31, and the branch 2 of the branching T microstrip line SL17 is connected to an RF pad 41 on the carrier substrate 31. A MMIC chip resistor 40 that implements an isolation resistor Rs (eg. 80 ohm) is connected between the RF pads 41 and 42, and thereby between the ports 2 and 3 of the Wilkinson divider.

Figure 6:
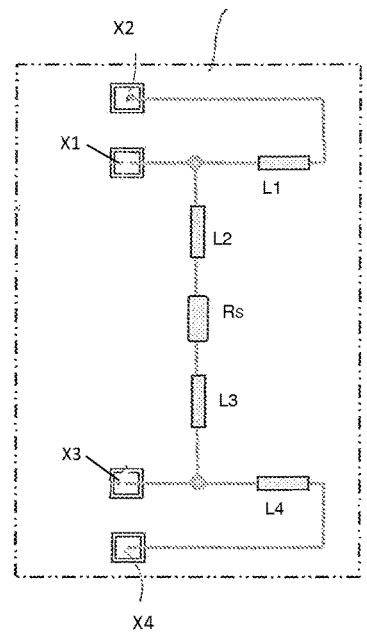
FIG. 6 illustrates an exemplary design of a MMIC chip resistor according to an embodiment of the invention.

An exemplary model of a MMIC chip resistor 40 according to an embodiment of the invention is illustrated in FIG. 6. The exemplary MMIC chip resistor 40 may comprise a first radio frequency (RF) input metal pad X1 connectable to the corresponding RF pad 42 on the carrier substrate 31, and a second radio frequency (RF) input metal pad X3 connectable the corresponding RF pad 41 on the carrier substrate 31. The exemplary MMIC chip 40 further comprises an isolation resistor $R_s$ integrated on the chip. The isolation resistor Rs may be implemented in any form applicable in the MMIC technology. Examples of different types of MMIC resistors include poly- and diffusion resistors for CMOS, NiCr resistors for GaAS, etc. The material may be tantalum or nitride, for example. The resistor Rs may be a thin film MMIC resistor. In the exemplary embodiment, the resistor Rs may be a tantalum thin film resistor of 80 ohm. The resistor Rs is connected between the RF input metal pads X1 and X3 by suitable means, for example by means of metal lines L2 and L3.

The RF input metal pads X1 and X3 may have parasitic capacitance towards ground potential. In an embodiment, a compensation circuit for parasitic capacitances caused by the RF input metal pads X1 and X3 may be provided on the MMIC chip 40 so that the on-chip resistor Rs appears as a pure resistance to the ports 2 and 3 of the Wilkinson divider on the carrier substrate 31. In an embodiment, the compensation circuit may be configured to create a parallel resonance circuit with the respective RF input metal pad X1 or X3 so that the effect of the parasitic capacitance will be resonated out. In an embodiment, a metal pad X2 connected to a reference potential or ground may be provided on the chip adjacent to the RF input metal pad X1. Further, an inductor L1 (e.g. a metal line) is connected between the metal pads X1 and X2 parallel with the parasitic capacitor caused by the RF input metal pad X1. Thereby, a parallel resonant circuit is obtained which compensates the parasitic capacitance of the RF input metal pad X1. Similarly, a metal pad X4 connected to a reference potential or ground may be provided on the chip adjacent to the RF input metal pad X3. Further, an inductor L4 (e.g, a metal line) may be connected between the metal pads X3 and X4 parallel with the parasitic capacitor caused by the RF input metal pad X3. Thereby, a parallel resonant circuit is obtained which compensates the parasitic capacitance of the RF input metal pad X3.

In an embodiment, the grounded metal pads X2 and X4 are configured to be ground contacts between the MMIC chip and the carrier substrate 31, i.e. to contact respective ground pads on the carrier substrate 31. Thereby, the metal pads X2 and X4 are connected or grounded both to the local ground of the MMIC chip and the ground of the carrier substrate 31, i.e. the MMIC chip and the carrier substrate 31 share the same ground. As a result, a well-defined return path can be obtained for a return current of the resonance circuit, i.e. the common ground.

Figure 2:
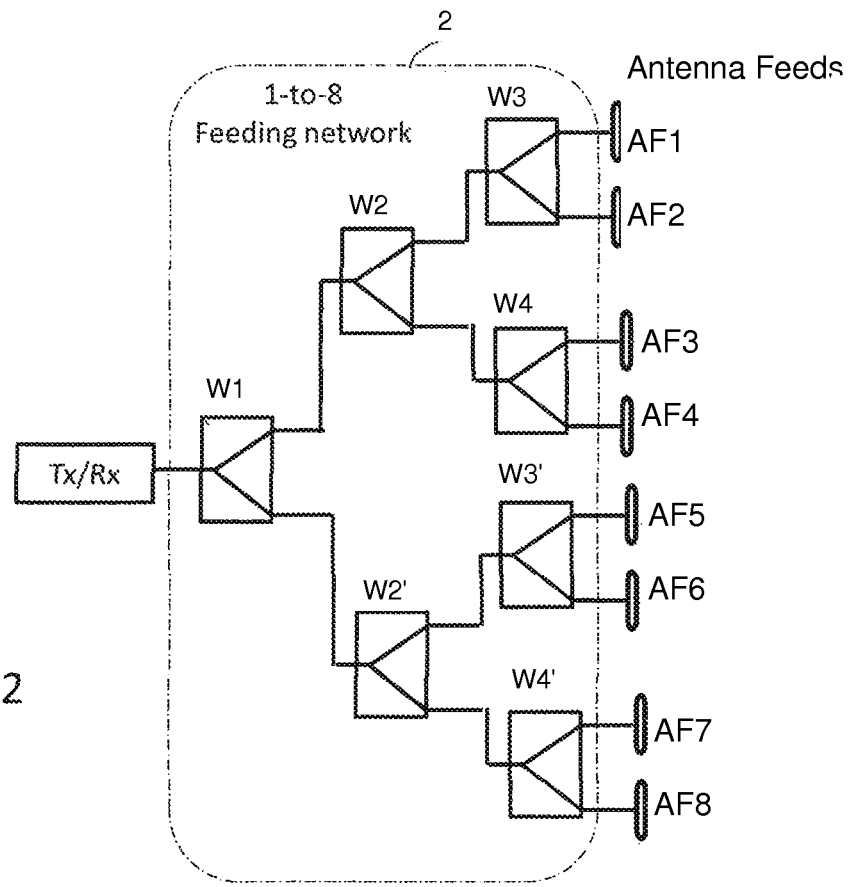
FIG. 2 is a schematic block diagram illustrating an exemplary 1-to-8 power distribution network.
Figure 7:
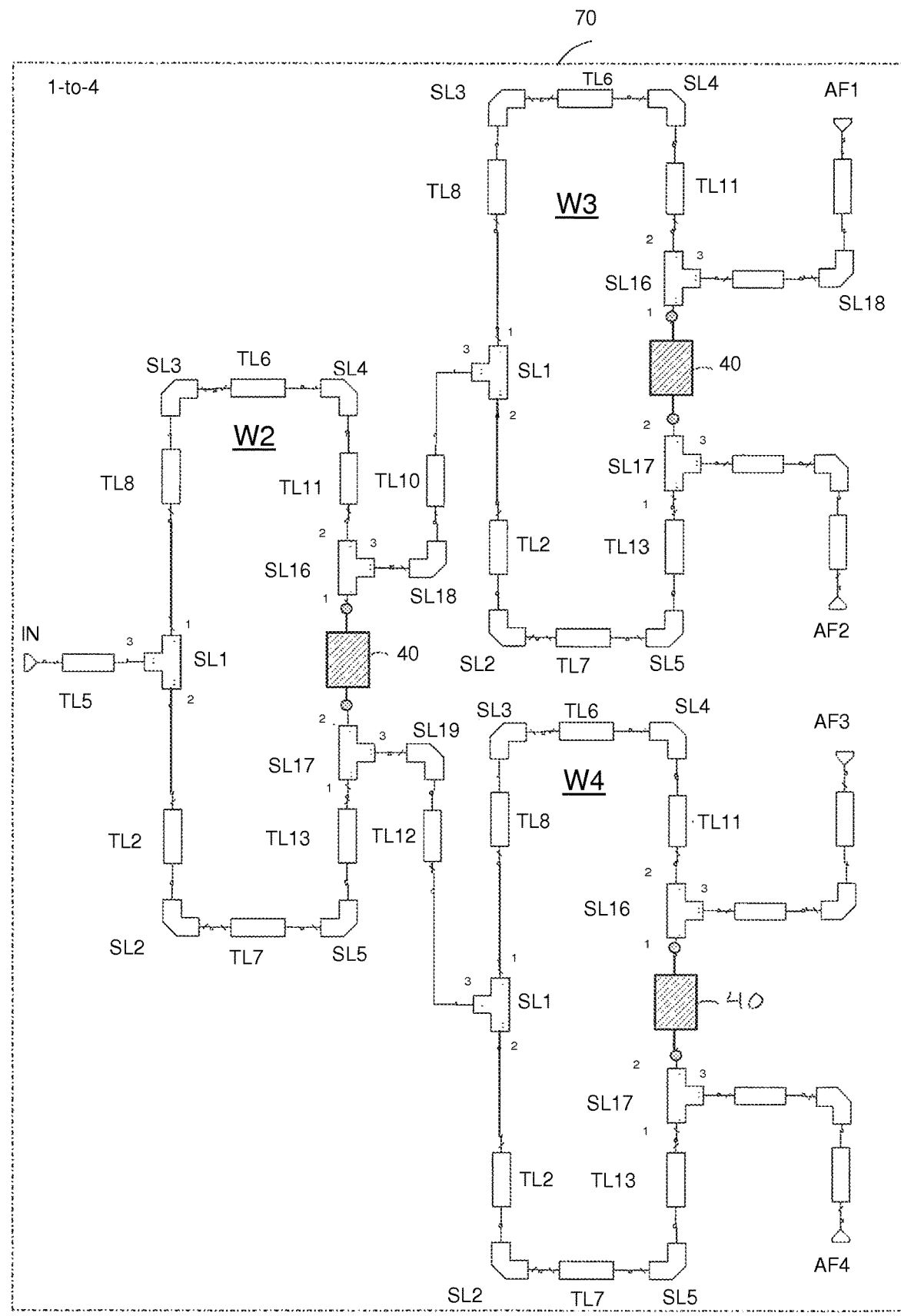
FIG. 7 illustrates an exemplary design of a 1-to-4 feeding network including three hybrid Wilkinson power dividers according to an embodiment of the invention.

A hybrid Wilkinson divider according to embodiments of the invention can be employed as a building element to construct larger feeding networks, such as the 1-to-8 feeding network 2 illustrated in FIG. 2. FIG. 7 illustrates an exemplary model of a 1-to-4 feeding network 70 including three hybrid Wilkinson power dividers according to embodiments of the invention. The feeding network 70 may implement, for example, each of the two parallel 1-to-4 feeding networks W2, W3, W4 and W2', W3', W4', respectively which feed eight outputs or radiating elements $FA_1$-$FA_8$. In FIGS. 3-7, same reference symbols present same or similar structures or functions. Similarly, larger feeding or power divider networks can be provided to provide feeds for 16, 64, 256, or 512 elements, for example.

In an embodiment, an MMIC chip contains an integrated isolation resistor for one hybrid Wilkinson divider having striplines for transmission line routing on a carrier substrate on which the MMIC chip is to be mounted.

In an embodiment, an MMIC chip contains an integrated isolation resistor for a plurality of hybrid Wilkinson dividers, i.e. two or more dividers, having striplines for transmission line routing on a carrier substrate on which the MMIC chip is to be mounted.

In an embodiment, an MMIC chip contains, in addition to one or a plurality of integrated isolation resistor, further MMIC components and/or electronic circuits, such as any one or more of passive components, active components, analog circuits, digital circuits, control circuits, etc. The MMIC area saved by using hybrid Wilkinson divider according to embodiments of the invention, may allow more additional circuitry on the same chip area, or allow same circuitry with less MMIC chip area.

Figure 8:
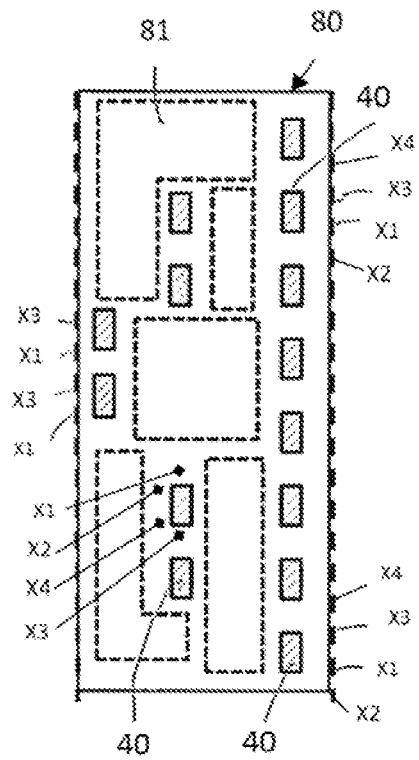
FIG. 8 illustrates schematically an exemplary MMIC chip containing a plurality of MMIC isolation resistors according to an embodiment of the invention as well as other circuitry.

FIG. 8 illustrates schematically an exemplary MMIC chip containing a plurality of MMIC isolation resistors 40 according to embodiments of the invention. The MMIC isolation resistors 40 are shown with a diagonal line fill. The MMIC isolation resistors 40 may be positioned on the MMIC chip 80 layout so that they readily connectable to the transmission line routing of the respective Wilkinson divider on the underlying carrier substrate when the MMIC chip is mounted. Positioning of each MMIC isolation resistors 40 and the associated contact pads X1 and X3, as well as the optional ground pads X2 and X4 on the MMIC chip 80 layout can be such that the area MMIC chip used effectively with minimum routing on the chip. Contact pads X1 and X3 of the MMIC isolation resistors 40, as well as the ground contact pads X2 and X3 may be on the edges of the MMIC chip 80, for example, as illustrated in FIG. 8. Contact pads X1 and X3 of the MMIC isolation resistors, as well as the ground contact pads X2 and X3, can be also in close proximity to the MMIC isolation resistors 40 on the MMIC chip 80, apart from the edges of the MMIC chip 80, as also illustrated in FIG. 80. The MMIC chip 80 shown in FIG. 8 might be suitable for the 1-to-8 feeding network 2 shown in FIG. 2, for example. The MMIC chip 80 may also contain further MMIC components and/or electronic circuits, as illustrated by broken line elements 81. Such elements may be include any one or more of passive components, active components, analog circuits, digital circuits, control circuits, etc.

Figure 9:
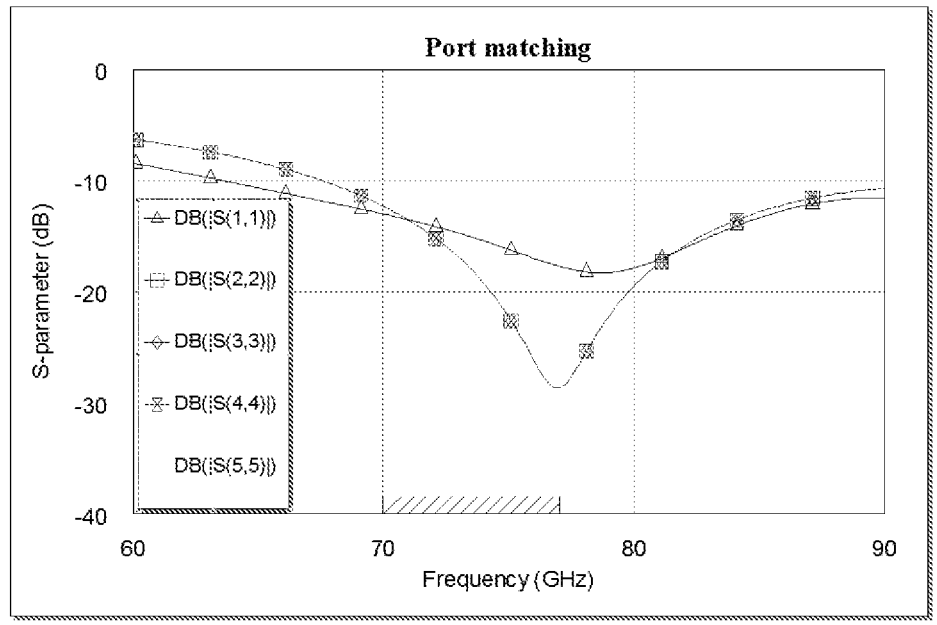
FIGS. 9, 10 and 11 show S-parameter graphs that illustrate a simulated port matching, a simulated coupling, and a simulated isolation in function of the signal frequency (60-90 GHz), respectively, for the 1-to-4 feeding network (FIG. 7) at which port 1 is "IN" and ports 2-5 denote "AF1-AF4", respectively.
Figure 10:
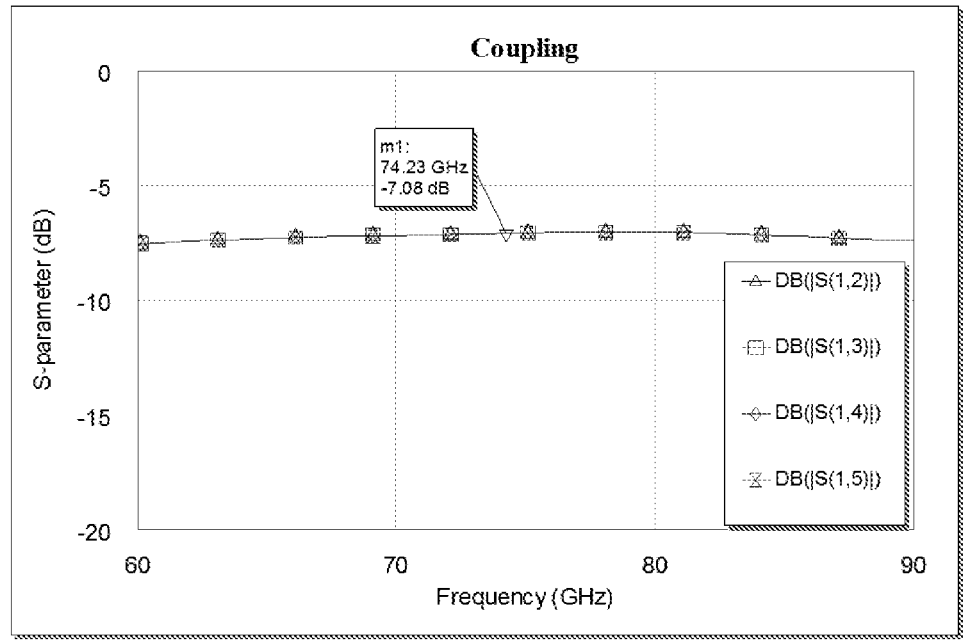
Figure 11:
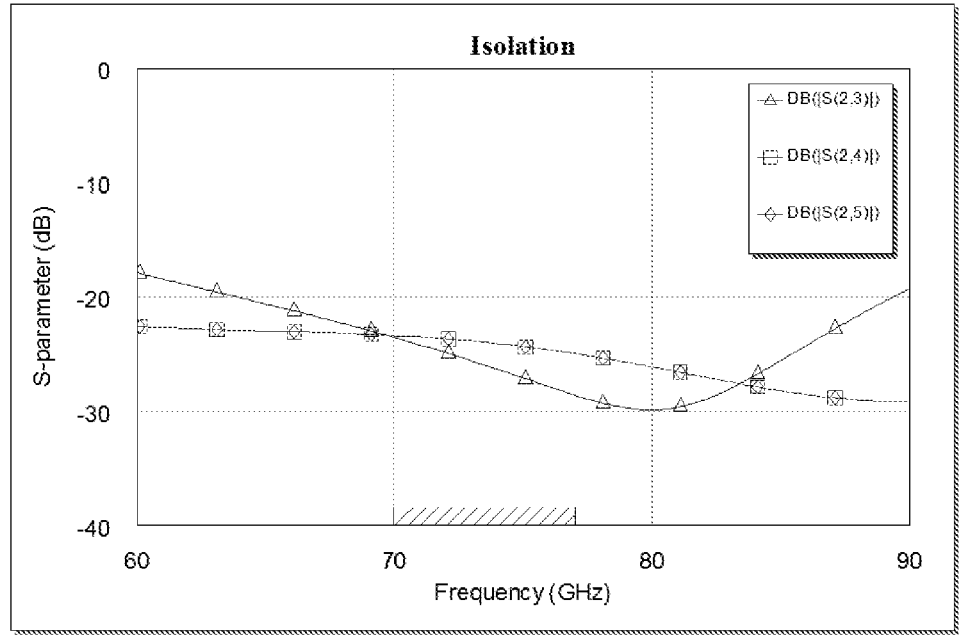

FIGS. 9, 10 and 11 are S-parameter graphs that illustrate a simulated port matching, a simulated coupling, and a simulated isolation in function of the signal frequency (60-90 GHz), respectively, for the 1-to-4 feeding network (FIG. 7) at which port 1 is "IN" and ports 2-5 denote "AF1-AF4", respectively. The simulations show the excellent performance of a hybrid Wilkinson divider according to embodiments of the invention. Embodiments of the invention are not intended to be limited to these exemplary frequencies but are applicable for all microwave and millimeter-wave signals, and especially frequencies higher than 20 GHz.

It will be obvious to a person skilled in the art that the invention and its embodiments are not limited to the examples described above but may vary within the scope of the claims.

The invention claimed is:

1. A hybrid millimeter-wave Wilkinson divider device, comprising:
   a carrier substrate,
   an input port, a first output port, a second output port, and transmission lines connecting the input port to the first and second output ports implemented by transmission lines in the carrier substrate,
   an isolation resistor connected between the first and second output ports, and the isolation resistor of the Wilkinson divider is integrated in a monolithic microwave integrated circuit (MMIC) chip installed on the carrier substrate, wherein the MMIC chip comprises a first input metal pad and a second input metal pad connected to first and second output ports, respectively, on the carrier substrate, and wherein the isolation resistor is connected between the first input metal pad and the second input metal pad in the MMIC chip, and the MMIC chip further comprises a first parallel resonant circuit for compensating a parasitic capacitance of the first input metal pad and a second parallel resonant circuit for compensating a parasitic capacitance of the second input metal pad.

2. A hybrid millimeter-wave device, comprising:
   a carrier substrate,
   at least one monolithic microwave integrated circuit (MMIC) chip installed on the carrier substrate, a signal distribution network configured to feed one input signal to a plurality of outputs, the signal distribution network including a plurality of Wilkinson dividers, each of the plurality of Wilkinson dividers further comprising an input port, a first output port, a second output port, transmission lines connecting the input port to the first and second output ports, and an isolation resistor connected between the first and second output ports, wherein the transmission lines of each Wilkinson divider is implemented in the carrier substrate, and the isolation resistor of each Wilkinson divider integrated in the at least one MMIC chip, and wherein the MMIC chip comprises a first input metal pad and a second input metal pad connected to first and second output ports, respectively, on the carrier substrate, and wherein the isolation resistor is connected between the first input metal pad and the second input metal pad in the MMIC chip, and the MMIC chip further comprises a first parallel resonant circuit for compensating a parasitic capacitance of the first input metal pad and a second parallel resonant circuit for compensating a parasitic capacitance of the second input metal pad.

3. The device as claimed in claim 2, wherein the signal distribution network is a 1-to-4, 1-to-8, 1-to-16, 1-to-64, 1-to-256. or 1-to-512 network, or any combination thereof.

4. The device as claimed in claim 1, wherein the first parallel resonant circuit comprises a first inductance connected from the first input metal pad to ground in the MMIC chip and thereby in parallel with the parasitic capacitance of the first input metal pad, and whereby the second parallel resonant circuit comprises a second inductance connected from the second input metal pad to ground in the MMIC chip and thereby in parallel with the parasitic capacitance of the second input metal pad.

5. The device as claimed in claim 4, wherein the MMIC chip comprises a third metal pad and a fourth connected to the ground, and wherein the first inductance is connected between the first input metal pad and the third metal pad, and wherein the second inductance is connected between the second input metal pad and the fourth metal pad.

6. The device as claimed in claim 4, wherein the third and fourth metal pads are configured to be ground contacts between the MMIC chip and the carrier substrate.

7. The device as claimed in claim 1, wherein the MMIC chip further comprises at least one further integrated component and/or electronic circuit.

8. The device as claimed in claim 1, wherein the carrier substrate is based on a printed circuit board (PCB) technology, Low-temperature cofired ceramic (LTCC) technology, integrated passive device (IPD) technology, or quartz substrate.

9. A millimeter wave phased array comprising a plurality of millimeter wave Wilkinson divider devices as claimed in claim 1.

10. A millimeter wave phased array comprising at least one millimeter wave device as claimed in claim 2.

11. A monolithic microwave integrated circuit (MMIC) chip, comprising:
   at least a first input metal pad and a second input metal pad for mounting the MMIC chip on a carrier substrate,
   at least one integrated isolation resistor configured, when the MMIC chip is mounted on the carrier substrate, to be connected via the first and second input metal pads to transmission lines in the carrier substrate to form a hybrid millimeter-wave Wilkinson divider with said carrier substrate transmission lines and
   wherein the MMIC chip comprises a first parallel resonant circuit and a second parallel resonant circuit on the MMIC chip configured to compensate parasitic capacitances of the first input metal pad and the second input metal pad, respectively, and wherein the first parallel resonant circuit preferably comprises a first inductance connected from the first input metal pad to ground and thereby in parallel with the parasitic capacitance of the first input metal pad, and whereby the second parallel resonant circuit preferably comprises a second inductance connected from the second input metal pad to ground and thereby in parallel with the parasitic capacitance of the second input metal pad.

12. The MMIC chip as claimed in claim 11, wherein the MMIC chip comprises a third metal pad and a fourth connected to the ground, and wherein the first inductance is connected between the first input metal pad and the third metal pad, and wherein the second inductance is connected between the second input metal pad and the fourth metal pad, and wherein the third and fourth metal pads are preferably configured to be ground contacts between the MMIC chip and the carrier substrate.

13. The MMIC as claimed in claim 11, wherein the MMIC chip comprises a plurality of integrated isolation resistors with respective pairs of first and second input metal pads to be connected to a plurality of transmission lines in the carrier substrate to form a plurality of hybrid millimeter-wave Wilkinson dividers, and wherein the MMIC chip optionally comprises at least one further integrated component and/or electronic circuit.

\* \* \* \* \*